(12) United States Patent
Höhler et al.

(10) Patent No.: US 6,639,958 B1
(45) Date of Patent: Oct. 28, 2003

(54) CIRCUIT CONFIGURATION FOR THE INTERFERENCE-FREE INITIALIZATION OF DELAY LOCKED LOOP CIRCUITS WITH FAST LOCK

(75) Inventors: Rainer Höhler, München (DE); Mathias Von Borcke, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/524,240

(22) Filed: Mar. 13, 2000

(30) Foreign Application Priority Data

Mar. 11, 1999 (DE) ......................................... 199 10 885

(51) Int. Cl.[7] .............................................. H03D 3/24
(52) U.S. Cl. ...................... 375/376; 327/149; 327/150; 327/151
(58) Field of Search ................ 375/376; 377/26; 327/147, 149, 150, 151, 153, 156, 158, 159, 160; 331/1 R, 17, 25, 1 A

(56) References Cited

U.S. PATENT DOCUMENTS

| | | | | |
|---|---|---|---|---|
| 5,771,264 A | * | 6/1998 | Lane ........................... | 375/376 |
| 6,087,868 A | * | 7/2000 | Millar ......................... | 327/156 |
| 6,281,726 B1 | * | 8/2001 | Miller, Jr. .................... | 327/156 |

FOREIGN PATENT DOCUMENTS

| | | |
|---|---|---|
| DE | 197 03 986 A1 | 12/1997 |
| DE | 197 32 142 A1 | 6/1998 |

OTHER PUBLICATIONS

International Publication WO 98/37656 (Donnelly et al.), dated Aug. 27, 1998.
Yoshinori Okajima et al.: "Digital Delay Locked Loop and Design Technique for High–Speed Synchronous Interface", IEICE Trans. Electron., vol. E79–C, No. 6, Jun. 1996, pp. 798–807.
Bum–Sik Kim et al.: "A Low Power 100 MHz All Digital Delay–Locked Loop", XP–000802928, pp. 1820–1823.
"A Semidigital Dual Delay–Locked Loop" (Sidiropoulos et al.), dated Nov. 1997, IEEE Journal of Solid State Circuits, vol. 32, No. 11, pp. 1683–1692.

* cited by examiner

*Primary Examiner*—Don N. Vo
(74) *Attorney, Agent, or Firm*—Laurence A. Greenberg; Werner H. Stemer; Ralph E. Locher

(57) ABSTRACT

The invention relates to a circuit configuration for the interference-free initialization of delay locked loop circuits with fast lock. A control signal for rapidly adjusting the DLL circuit is converted into a delayed control signal, which is kept constant with the rising edge of a counter clock signal. This prevents instabilities of the counter value from occurring.

9 Claims, 3 Drawing Sheets

FIG. 1
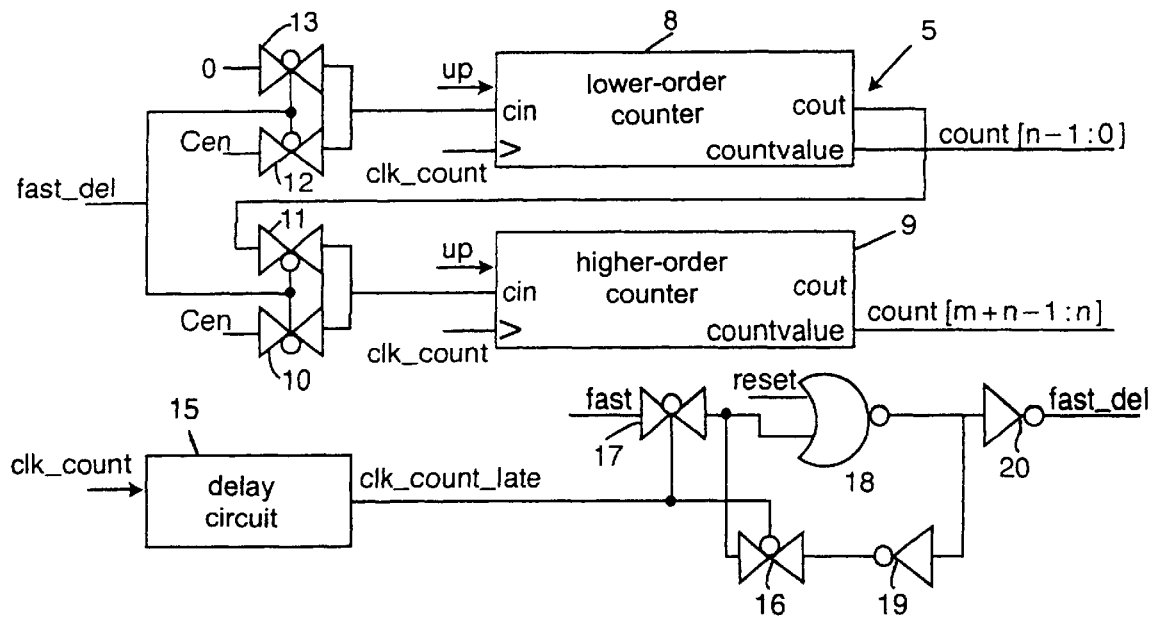
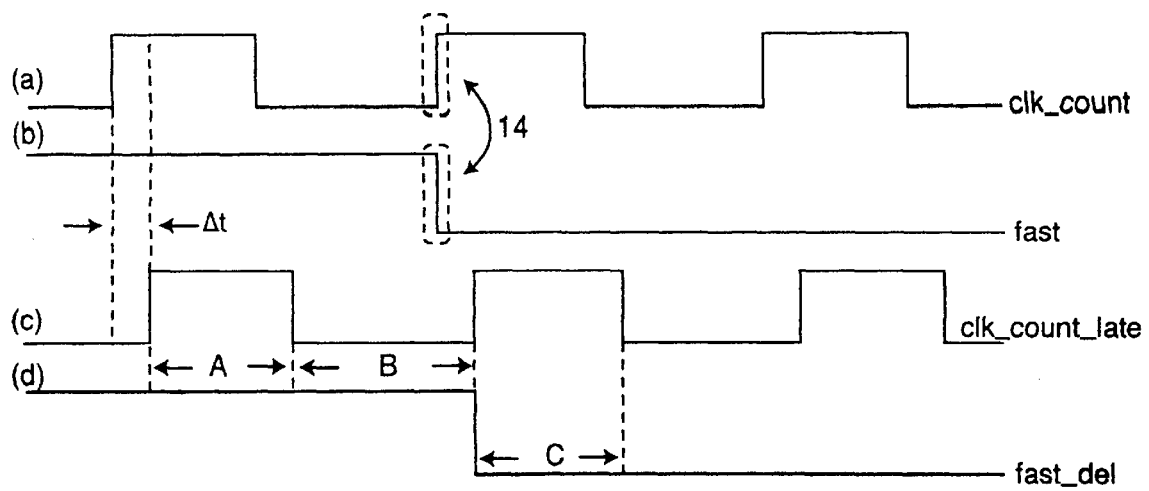
FIG. 2

US 6,639,958 B1

CIRCUIT CONFIGURATION FOR THE INTERFERENCE-FREE INITIALIZATION OF DELAY LOCKED LOOP CIRCUITS WITH FAST LOCK

BACKGROUND OF THE INVENTION

Field of the Invention

The present invention pertains to delay locked loops and, more particularly, to a circuit configuration for the interference-free initialization of delay locked loop circuits (DLL circuits) with fast lock, in which

- an on-chip clock signal is synchronized with an external clock signal by means of a delay line driven via a phase detector, a filter, a counter device and a digital/analog converter; and
- the counter device comprises at least one higher-order counter and a lower-order counter, which can each be triggered by a counter clock signal and can alternatively be activated and deactivated by means of a control signal, in order to shorten the time taken to adjust the DLL.

In integrated circuits having, for example, a so-called Rambus interface, a clock signal fed in externally to the integrated circuit is required at numerous locations. This presupposes a high gain for the clock signal fed in externally. However, such a high gain is inevitably associated with corresponding delay times. Therefore, an internal clock signal is preferably generated from an external clock signal and is fed with a time shift, with the correct phase angle in each case, to those locations of the integrated circuit which require such a clock signal.

The conversion of an external clock signal into an internal clock signal having the desired phase angle is, therefore, a problem which arises generally in integrated circuits.

The block circuit of FIG. 4 diagrams the structure of a circuit configuration used to obtain an internal clock signal Ti from an external clock signal Te. For this purpose, the external clock signal Te is fed to a voltage-controlled delay line 1, which supplies the internal clock signal Ti synchronized with the external clock signal Te. For this purpose, the voltage-controlled delay line 1 can be driven by a control signal in such a way that its delay is variable. This control signal is expediently generated by a phase detector 2 and a filter 3. By means of the phase detector 2, firstly the phase of the internal clock signal Ti at the output of the voltage-controlled delay line 1 is compared with the phase of the external clock signal Te at the input of the delay line. A signal representing the comparison result is fed to the filter 3, which expediently comprises a low-pass filter component, in order to bring the delay time of the voltage-controlled delay line 1 slowly to the desired length.

A circuit configuration corresponding to FIG. 4 is described in detail for example by Sidiropoulos and Horowitz, in "A Semidigital Dual Delay-Locked-Loop," IEEE Journal of Solid-State Circuits, Volume 32, No. 11, Nov. 1997, Pages 1683–92.

FIG. 5 shows a circuit configuration which is derived from the circuit configuration disclosed in the aforementioned document. In detail, FIG. 5 illustrates a DLL circuit in which the output of the phase detector 2, which is located between the input and the output of the voltage-controlled delay line 1, is connected to the control input of the voltage-controlled delay line 1 via a digital low-pass filter 4, a digital counter 5 and a digital/analog converter 6. The digital counter 5 counts up or down depending on the level of the output signal of the digital low-pass filter 4. A clock signal clk_count for the digital counter 5 is generated from the high-frequency external clock signal Te by the clock signal Te being divided down by means of a frequency divider 7, as a result of which a low-pass filter behavior is achieved for the digital counter 5.

The current counter reading of the digital counter 5 is converted, with the aid of the digital/analog converter 6, into an analog control signal delay_control, which finally influences the length of the voltage-controlled delay line 1.

In order, in the case of this circuit configuration, to shorten the time taken to adjust the DLL during initialization, a control signal "fast" is introduced, which triggers the digital counter 5 during initialization. In addition, the initialization is subdivided into two phases: the signal "fast" is activated in a first phase, while it is deactivated in the second phase. During the first phase, in which the control signal "fast" is activated, the lower-order bits of the digital counter 5 are deactivated and the higher-order bits are directly addressed.

For this purpose, the digital counter 5 is subdivided into two units, namely, as is shown in FIG. 6, into a lower-order n-bit counter 8 and a higher-order m-bit counter 9.

In the first phase, the signal "fast" is activated, that is to say is at a logic "1", with the result that a transmission gate 10 is open, while transmission gates 11 and 12 are inhibited and a transmission gate 13 is likewise open. As a result, an activation signal cen for the counters is present at the higher-order counter 9 directly via the transmission gate 10, while the lower-order counter 8 is deactivated.

Thus, on account of the activation of the higher-order counter 9, the counter 5 counts in distinctly larger steps compared with a normal operating mode, and the DLL approximates to the desired output phase faster. If the control signal "fast" is subsequently deactivated, that is to say changed to "0", in a second phase, the activation signal cen is switched directly to the lower-order counter 8 via the transmission gate 12, and the carry bit "count" of the lower-order counter 8 is switched through to the carry input cin of the higher-order counter 9 via the transmission gate 11.

As a result, all bits are activated, and the counter 5 counts in correspondingly smaller steps. The DLL can then adjust the desired output phase with a higher temporal resolution.

Like FIG. 5, FIG. 6 also shows the clock inputs clk_count and control inputs up for the counting direction of the counters 8, 9 and output terminals "countvalue", for supplying output signals count[n−1:0] for the counter 8 and respectively count[m+n−1:n] for the counter 9.

In the prior art circuit configuration shown in FIGS. 5 and 6, problems arise when the control signal "fast" is deactivated at an arbitrary instant. Reference is had, in this regard, to FIG. 2(a) which shows the profile of the clock signal clk_count, and to FIG. 2(b) which illustrates the control signal "fast", in the prior art circuit configuration. If the deactivation of the control signal "fast" almost or entirely coincides temporally with a change in the level of the clock signal, as is indicated by a double arrow 14 in FIG. 2, then instabilities can occur in the counter value countvalue, which causes the entire DLL to be in a state in which it can no longer adjust the desired phase angle of the internal clock signal Ti.

SUMMARY OF THE INVENTION

It is accordingly an object of the invention to provide a circuit configuration for the interference-free initialization of DLL circuits with fast lock, which overcomes the above-mentioned disadvantages of the heretofore-known devices and methods of this general type and in which instabilities of counter values on account of the deactivation of a counter control signal are avoided.

With the foregoing and other objects in view there is provided, in accordance with the invention, a circuit configuration for the interference-free initialization of delay locked loop circuits with fast lock, which comprises:

a delay line receiving an external clock signal and outputting an on-chip clock signal;

a phase detector, a filter, a counter device and an analog/digital converter connected to and driving the delay line for synchronizing the on-chip clock signal with the external clock signal;

the counter device having at least one higher-order counter and a lower-order counter each triggered by a counter clock signal and alternatively activatable and deactivatable with a control signal for shortening a time taken to adjust the delay locked loop;

wherein the control signal is converted into a delayed control signal kept constant with a rising edge of the counter clock signal.

In accordance with an added feature of the invention, there is provided a delay circuit for converting the counter clock signal into a delayed clock signal taking over the control signal shortly after the rising edge of the counter clock signal.

In other words, the delay circuit converts the counter clock signal into a delayed clock signal with which the control signal is sampled shortly after the rising edge of the counter clock signal.

In the circuit configuration according to the invention, therefore, the control signal "fast", whose falling edge can intrinsically occur at an arbitrary instant, is converted into a delayed signal whose edge then occurs at an instant at which instabilities of the counter cannot arise. For this purpose, firstly a delayed clock signal is generated for the counter, with which the control signal is accepted shortly after the rising edge of the clock signal. During the falling edge of the delayed clock signal for the counter, the delayed control signal is kept constant until the next sampling instant. The effect achieved as a result of this is that the delayed control signal is kept constant while it can influence the counter output signal, that is to say during the rising edge of the clock signal. In other words, stable operation of the counter can be ensured by the circuit configuration according to the invention.

The circuit configuration according to the invention thus firstly generates a delayed "copy" of the counter clock signal by means of a delay circuit. The control signal for the counter is sampled with this delayed clock signal, and the falling edge of the control signal delayed in this way is shifted into a time range that is not critical for the operation of the counter.

In accordance with an additional feature of the invention, a transmission gate is connected downstream of the delay circuit in a direction of signal flow, the transmission gate having an input receiving the control signal.

In accordance with another feature of the invention, a second transmission gate is connected downstream of the delay circuit in the direction of signal flow, between the output of the first above-mentioned transmission gate and an inverter.

In accordance with a further feature of the invention, a NOR gate having an output connected to a circuit node between the above inverter and a further inverter is connected downstream of the transmission gate.

In accordance with again an added feature of the invention, the delay circuit is formed of a plurality of inverters.

In a preferred embodiment, the inverters are provided with a capacitive load. The last inverter stage should thereby be without a capacitive load.

In accordance with a concomitant feature of the invention, the delay circuit is constructed of flip-flops that are triggered with a sufficiently high-frequency clock signal.

Other features which are considered as characteristic for the invention are set forth in the appended claims.

Although the invention is illustrated and described herein as embodied in a circuit configuration for the interference-free initialization of DLL circuits with fast lock, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a schematic diagram of an exemplary embodiment of the circuit according to the invention;

FIG. 2 is a graph with signal profiles of a prior art circuit configuration (lines a and b) and in the circuit configuration according to the invention (lines c and d);

DESCRIPTION OF THE PREFERRED EMBODIMENTS

Figure 4:
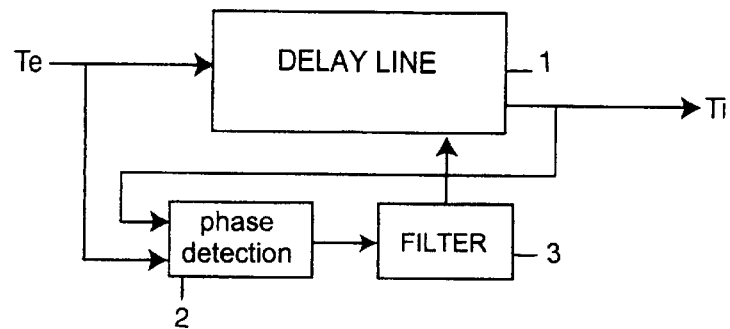
FIG. 4 is a block diagram explaining an existing circuit configuration.
Figure 5:
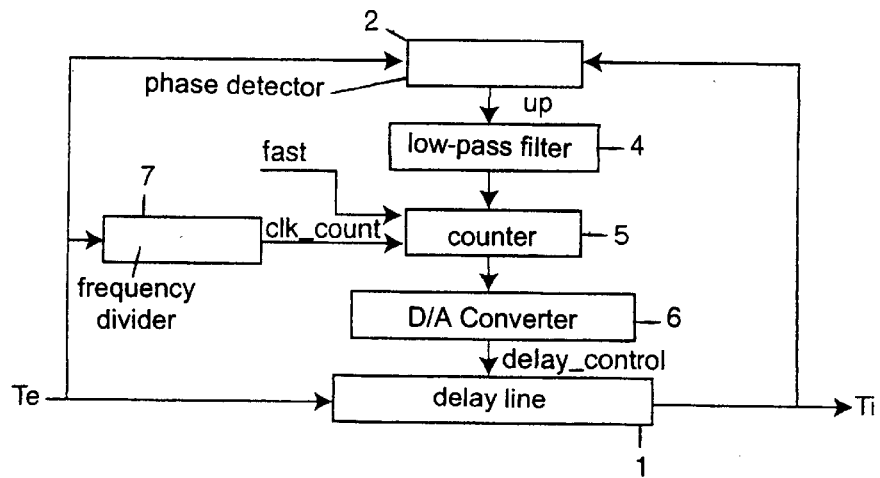
FIG. 5 is a more detailed block diagram for the circuit configuration of FIG. 4.
Figure 6:
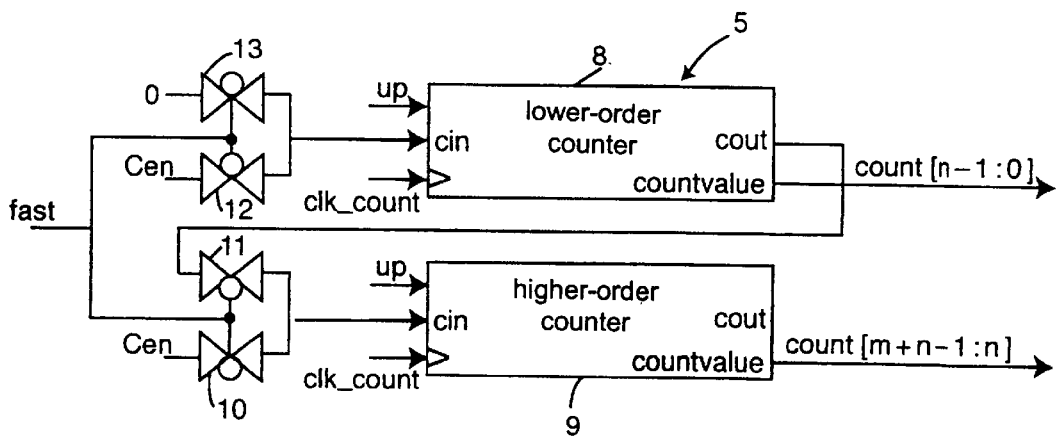
FIG. 6 is a diagram of details of the digital counter 5 of FIG. 5.

FIGS. 4 to 6 and the signal lines (a) and (b) of FIG. 2 have been described in the introduction above. In the figures, the same reference symbols are used in each case for mutually corresponding structural parts. Further, in the exemplary embodiment of FIG. 1, structural parts which correspond to the prior art counter of FIG. 6 will not be described in any detail.

Referring now to the figures of the drawing in detail that deal with the invention and first, particularly, to FIG. 1 thereof, there is seen an exemplary embodiment of the circuit configuration according to the invention, in which, in addition to the circuit configuration of FIG. 6 (and FIG. 5), a delay circuit 15 is also provided, which delay circuit generates, from the clock signal clk_count, a delayed clock signal clk_count_late, which is at the same frequency as the clock signal clk_count but is temporally delayed with respect thereto, with the result that it occurs somewhat later. The delayed clock signal is fed to a transmission gate 16, which is open in the event of logic "0", and a transmission gate 17 which is open when logic "1" is present. The transmission gate 17 being located in the signal path of the control signal "fast". The output of the transmission gate 17 is connected to the input of an inverter 20 via a NOR gate 18 and respectively the transmission gate 16 and an inverter 19, a delayed control signal "fast_del" being obtained at the output of the inverter 20. In this circuit configuration, the clock signal clk_count_late is used for switching the control signal "fast" through to the delayed control signal "fast_del" in a transparent manner while the delayed clock signal clk_count_late is at "1" or high, and for keeping the delayed control signal "fast_del" constant while the delayed clock signal clk_count_late is at 0 or low.

In other words, the delayed clock signal clk_count_late assumes the profile delayed by Δt and shown in FIG. 2(c) with regard to the clock signal clk_count, while the delayed control signal "fast_del" only undergoes a transition to a low state in a noncritical time range after it has first been at "1" for a time period A corresponding to the control signal and this state is maintained during a time period B. In a time period C, the delayed control signal again accepts the profile of the control signal "fast" and subsequently maintains it, etc.

Since, after a reset, the system fundamentally operates in a mode in which the control signal "fast" is in a high state, setting of the delayed control signal "fast_del" while "reset" equals high is integrated with the gate 18.

Figure 3A:
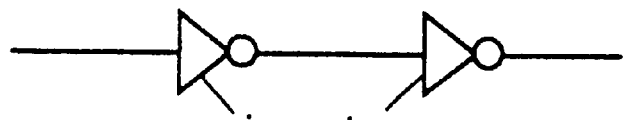
FIGS. 3A–3D are diagrams of possible configurations of a delay circuit.
Figure 3B:
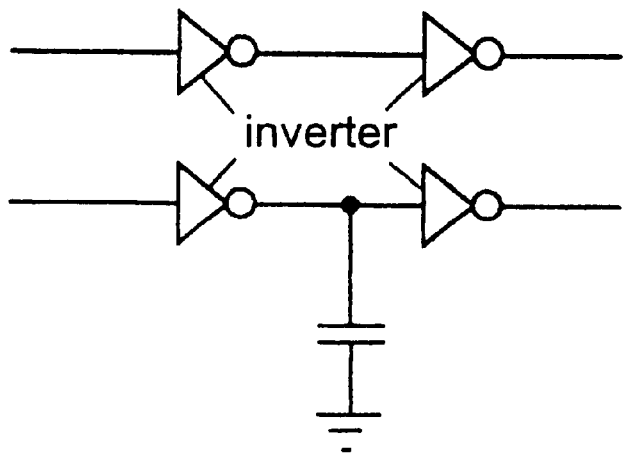
Figure 3C:
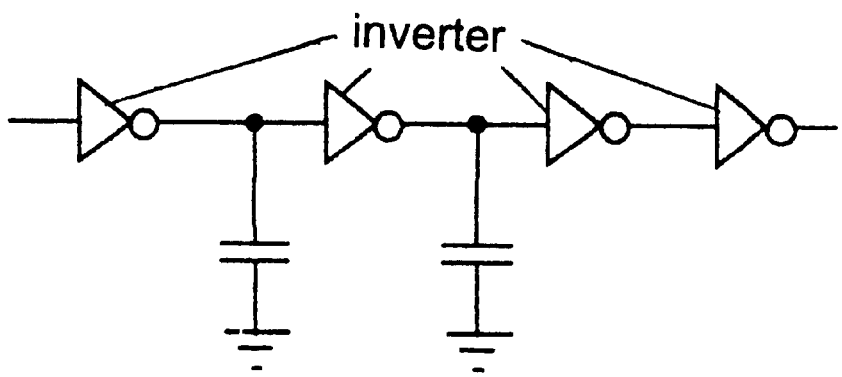
Figure 3D:
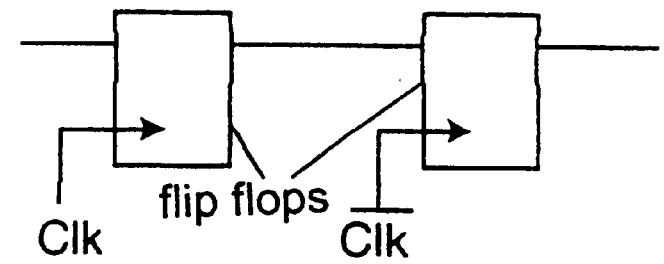

FIGS. 3A to 3D illustrate various exemplary embodiments of the configuration of the delay circuit 15. The latter may comprise for example the series circuit formed by an even number of inverters (FIG. 3A), which may be provided with a capacitive load between the inverters (FIG. 3B), where the last inverter stage should not be loaded (FIG. 3C). Likewise, it is possible, instead of the inverters, to realize the delay circuit 15 with the aid of a digital circuit made of flip-flops triggered with a sufficiently high-frequency clock signal clk (FIG. 3D).

We claim:

1. A circuit configuration for the interference-free initialization of delay locked loop circuits with fast lock, which comprises:

a delay line receiving an external clock signal and outputting an on-chip clock signal;

a phase detector, a filter, a counter device and an analog/digital converter connected to and driving said delay line for synchronizing the on-chip clock signal with the external clock signal;

said counter device having at least one higher-order counter and a lower-order counter each triggered by a counter clock signal and alternatively activatable and deactivatable with a control signal for shortening a time taken to adjust the delay locked loop;

wherein the control signal is converted into a delayed control signal and kept constant with a rising edge of the counter clock signal.

2. The circuit configuration according to claim 1, which further comprises a delay circuit for converting the counter clock signal into a delayed clock signal taking over the control signal shortly after the rising edge of the counter clock signal.

3. The circuit configuration according to claim 2, which comprises a transmission gate connected downstream of said delay circuit in a direction of signal flow, said transmission gate having an input receiving the control signal.

4. The circuit configuration according to claim 3, wherein said transmission gate is a first transmission gate having an output, and a second transmission gate is connected downstream of said delay circuit in the direction of signal flow, between said output of said first transmission gate and an inverter.

5. The circuit configuration according to claim 4, which comprises a further inverter connected to said first-mentioned inverter via a node, and a NOR gate having an output connected to said node between said inverters, said NOR gate being connected downstream of said transmission gate.

6. The circuit configuration according to claim 2, wherein said delay circuit is formed of a plurality of inverters.

7. The circuit configuration according to claim 6, wherein said inverters are provided with a capacitive load.

8. The circuit configuration according to claim 7, wherein a last inverter stage is without a capacitive load.

9. The circuit configuration according to claim 2, wherein said delay circuit is constructed of a plurality of flip-flops.

* * * * *